United States Patent
Zerbe (12)

(10) Patent No.: US 6,204,697 B1
(45) Date of Patent: Mar. 20, 2001

(54) LOW-LATENCY SMALL-SWING CLOCKED RECEIVER

(75) Inventor: Jared L. Zerbe, Palo Alto, CA (US)

(73) Assignee: Rambus Inc., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/390,218

(22) Filed: Sep. 3, 1999

Related U.S. Application Data

(63) Continuation of application No. 08/896,934, filed on Jul. 18, 1997
(60) Provisional application No. 60/038,901, filed on Feb. 28, 1997.

(51) Int. Cl.⁷ .................................................. H03K 19/096
(52) U.S. Cl. .............................. 326/98; 326/81; 326/115
(58) Field of Search .................................. 326/82, 83, 86, 326/93, 95, 97, 98, 115, 121; 327/55, 67

(56) References Cited

U.S. PATENT DOCUMENTS

| | | | |
|---|---|---|---|
| 4,247,791 | * | 1/1981 | Rovell .................................... 327/55 |
| 4,973,864 | * | 11/1990 | Nagami .................................. 327/55 |
| 5,023,488 | * | 6/1991 | Gunning ................................. 326/86 |
| 5,355,391 | * | 10/1994 | Horowitz et al. ...................... 375/36 |
| 5,513,327 | * | 4/1996 | Farmwald et al. .................... 395/309 |
| 5,606,717 | * | 2/1997 | Farmwald et al. .................... 395/856 |
| 5,621,340 | * | 4/1997 | Lee et al. .............................. 327/65 |
| 5,659,258 | * | 8/1997 | Tanabe et al. ......................... 326/83 |
| 5,729,178 | * | 3/1998 | Park et al. ............................. 327/536 |
| 5,977,798 | * | 11/1999 | Zerbe .................................... 326/98 |

* cited by examiner

Primary Examiner—Michael Tokar
Assistant Examiner—Don Phu Le
(74) Attorney, Agent, or Firm—Pennie & Edmonds LLP

(57) ABSTRACT

The present invention achieves the stated input receiver goals by merging many of the different functions required into a single unit instead of serializing them in the more traditional fashion. The present invention provides a receiver circuit having both a source-follower pair of MOS transistors, and a source-coupled pair of MOS transistors. The connecting node between these two pairs is coupled to a sense amplifier. The simultaneous use of the source-follower pair, the source-coupled pair and the sense-amplifier transistors allows for fast amplification of the low-swing input to full-rail CMOS, when triggered by a CMOS input clock.

37 Claims, 4 Drawing Sheets

LOW-LATENCY SMALL-SWING CLOCKED RECEIVER

This is a continuation of application Ser. No. 08/896,934, filed Jul. 18, 1997, Provisional Application No. 60/038,901, filed on Feb. 28, 1997.

BACKGROUND OF THE INVENTION

The present invention relates to receiver circuits, and in particular to clocked receivers for amplifying low-swing signals to full-rail CMOS.

Faster VLSI devices put an ever increasing demand on bandwidth requirements for point-to-point and distributed busses. Frequently these busses experience large overshoots and undershoots if an attempt is made to drive them to the full range of the power supply. One effective technique used to make these interfaces run faster without such noise problems is to reduce the voltage swings below the full supply rails. This creates a new requirement for fast, low-swing data receivers and output drivers.

The requirement that a data receiver must be fast implies that it must have high bandwidth internally. Since signals inside CMOS VLSI devices are typically distributed as full-swing signals for noise-immunity and ease of use, the receiver should also have gain to amplify from low-swing to full-swing.

However, VLSI amplifiers in general experience a limited gain-bandwidth product. Thus, if it is desired to amplify low swings to full-rail CMOS (gain), some speed (bandwidth) is usually lost. In order to overcome speed and bandwidth limitations, two or more gain stages are often put in series. This unfortunately results in higher latency to valid output data. Achieving low latency is very important because it effects the actual time required to get the first data off of a bus and into the device. Another desirable quality for a low-swing receiver is a large input common-mode voltage range. Frequently, the actual input voltage levels are determined by many other factors in the environment, such as output driver characteristics, line impedance, available power supplies, etc. An input receiver with a large common mode range can avoid further constraining the voltage range. In summary, basic desirable qualities for a low-swing receiver include 1) good gain, 2) low latency, and 3) large common mode range. As with many VLSI circuits, additional favorable qualities include small physical area and low power consumption.

Receivers in the prior art, such as that of U.S. Pat. No. 5,319,755, entitled "High Speed Bus System", by Horowitz & Lee, as illustrated in FIG. 1 have several undesirable characteristics which are avoided in this invention.

First, in Horowitz/Lee, the input differential data BusData and Vref are sampled by a full-CMOS passgate, which means that the P+ diffusion of the PFETs of T1 and T2 are connected directly to device pins. This can lead to a latch-up condition if the power-up sequence is not tightly controlled, i.e., the pin is powered up before the well.

Second, the circuit is dependent on the distribution of a bias voltage, labelled VBIAS. U.S. Pat. No. 5,023,488 of Gunning has a similar bias requirement. In general, input receivers are usually distributed across the full width of a VLSI device. Voltage bias lines running large distances across a mixed-signal CMOS device are frequently disturbed by coupling capacitances to adjacent high-speed wires or by the substrate itself. It can in practice be very difficult to distribute quiet voltage-bias wires in a noisy environment.

Third, the circuit makes use of the signals CLK and nCLK, with each going into complementary devices. If the skew between the rising edge of CLK and the falling edge of nCLK is not very well controlled, it can lead to a condition where the data feeds through from the master to the slave latch a phase earlier than desired. Lastly, the latency of this design is quite high, requiring at least one full clock cycle plus the clock-to-Q delay of the final sense-amplifier.

SUMMARY OF THE INVENTION

The present invention achieves the stated input receiver goals by merging many of the different functions required into a single unit instead of serializing them in the more traditional fashion. The present invention provides a receiver circuit having both a source-follower pair of MOS transistors, and a source-coupled pair of MOS transistors. The connecting nodes between these two pairs are coupled to a sense amplifier. The simultaneous use of the source-follower pair, the source-coupled pair and the sense-amplifier transistors allows for fast amplification of the low-swing input to full-rail CMOS.

In a preferred embodiment, the nodes are connected to outputs through inverters. A power down transistor is coupled to the drains of the source-follower pair. Power saving transistors are connected to the drains of the source-coupled pair, with their gates coupled to the opposite connecting node. Pre-discharge transistors are connected to the common nodes between the source-follower and source-coupled transistors. All of the clock inputs to the circuit use the same phase of the clock, avoiding any possibility of skew-induced race conditions.

In a preferred embodiment, the present invention provides a data input receiver for boosting a low-swing data input signal to a full swing CMOS data output signal with low delay between the input and output. The data receiver receives a low-swing differential signal from a high speed bus, and combines boosting of the low-swing data to full-swing CMOS with latching for retention and use by subsequent circuits in order to achieve both functions in minimal time. The data receiver operates in less than one cycle of a single input clock, has a large common mode range, requires no bias inputs and has very small setup and hold requirements. Furthermore, the receiver may be powered down and returned to an active condition in less than one cycle of the input clock.

For a further understanding of the nature and advantages of the invention, reference should be made to the following description taken in conjunction with the accompanying drawings.

DETAILED DESCRIPTION OF THE PREFERRED EMBODIMENT

Figure 1:
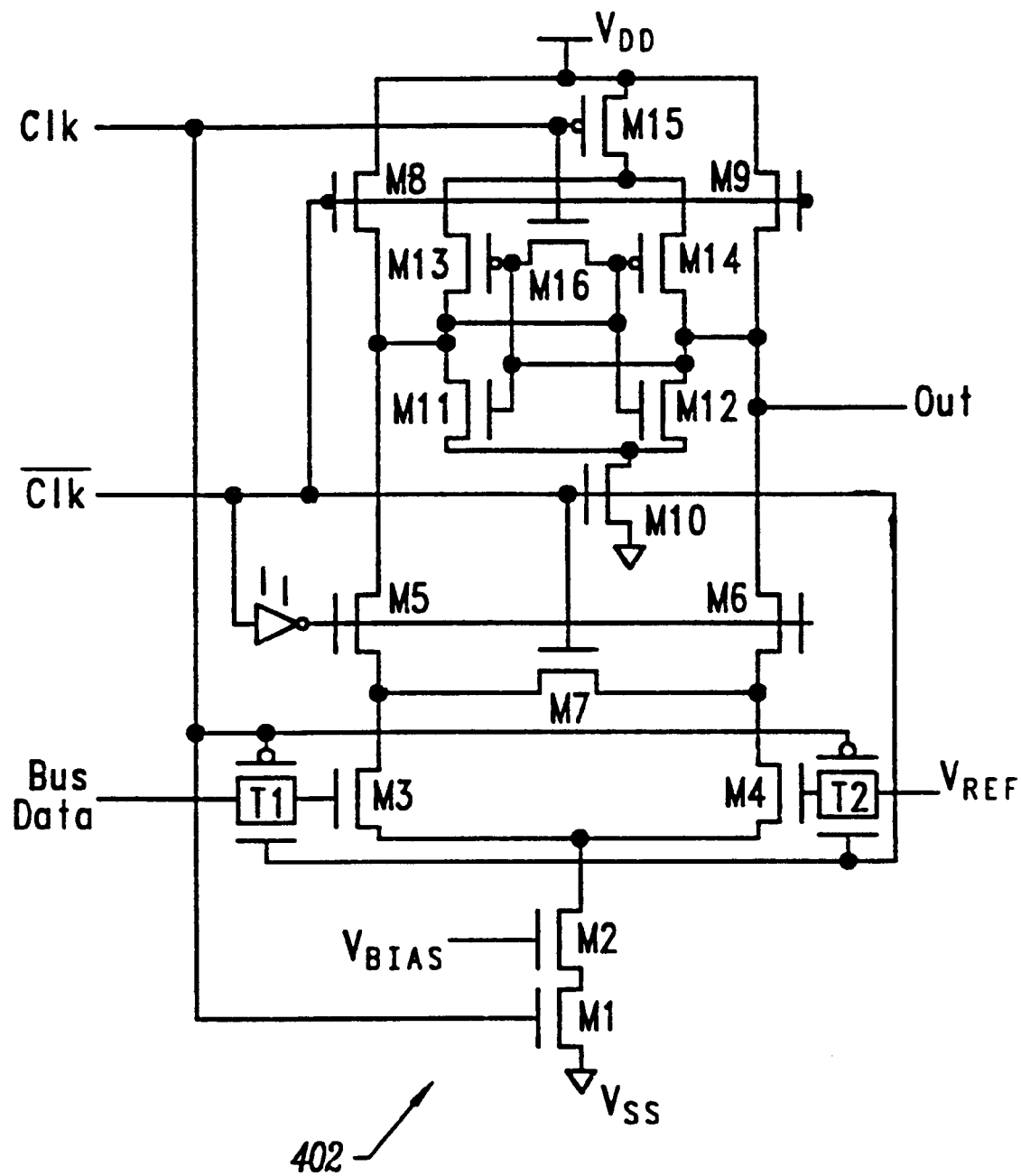
FIG. 1 is a diagram of a prior art receiver.
Figure 2:
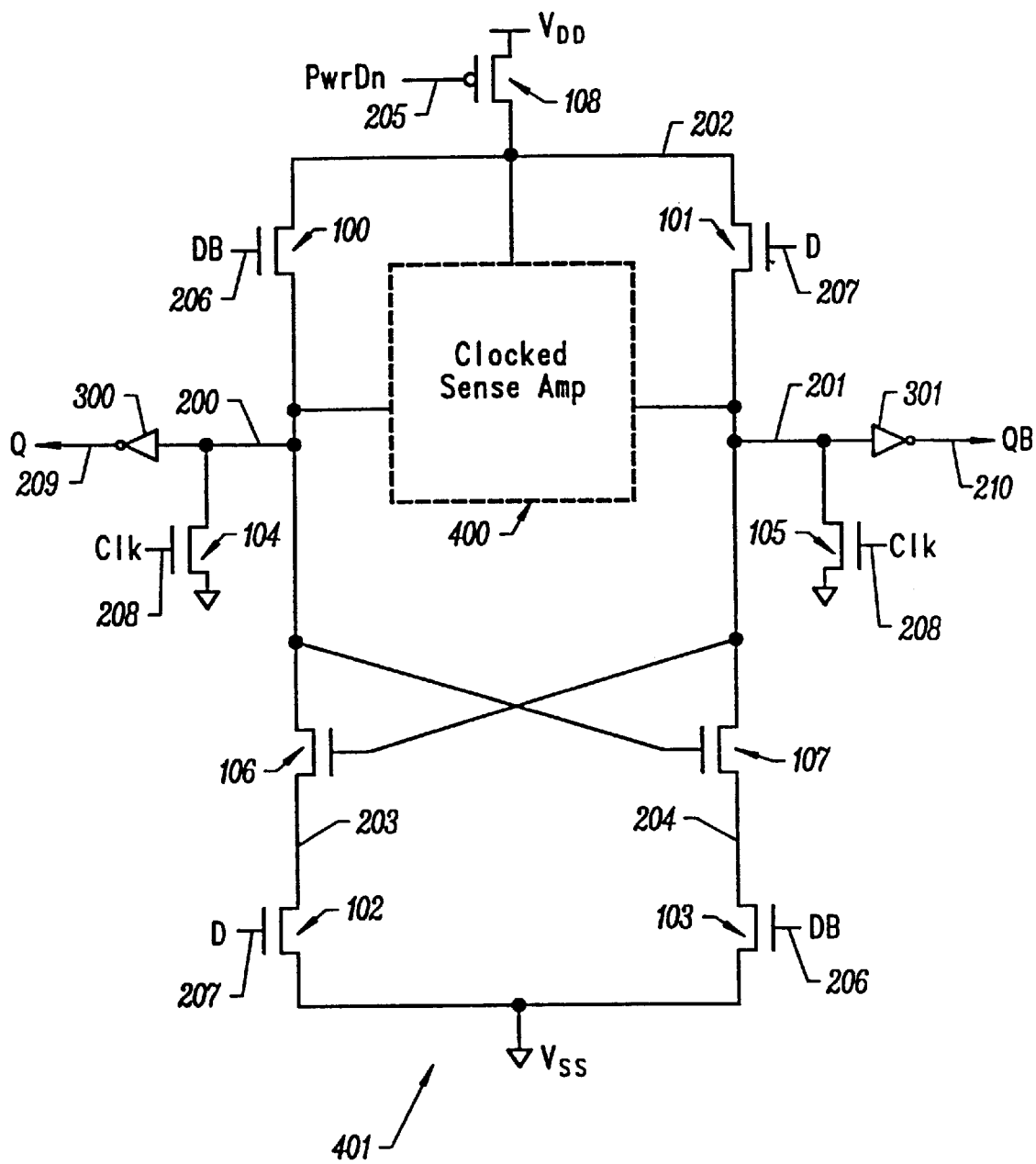
FIG. 2 is a circuit diagram of a receiver according to one embodiment of the invention.

The present invention functions as a single-unit, with several distinct portions of the receiver, the first being the input pairs. Referring to FIG. 2, nfets 100, 101, 102, and 103 make up the input devices and are driven by the differential input signals. The use of both the source-follower nmos pair 100 & 101 and the source-coupled nmos pair 102 & 103 allows for large input common-mode input range. When the input common-mode is high, the source-follower pair provides the majority of the differential current into the differential sense-amp I/O nodes 200 and 201. When the common-mode is low, the source-coupled nmos pair 102 & 103 provide the majority of the differential current. At intermediate common-modes both pairs contribute to the differential current, allowing for operation beyond what either pair would be able to do alone. The receiver is also pre-discharged, and in its ready-state the source-follower pair provides substantial differential current. The simultaneous use of the source-follower pair, the source-coupled pair, and the sense-amp transistors allows for extremely fast amplification of the low-swing input to full-rail CMOS. This fast amplification has the secondary benefit of small setup and hold requirements. In addition, in power-down the majority of the circuit is in the same state as when it is pre-discharged. This, as well as the lack of bias inputs, allows for activation from power-down in less than 1 cycle.

Figure 3:
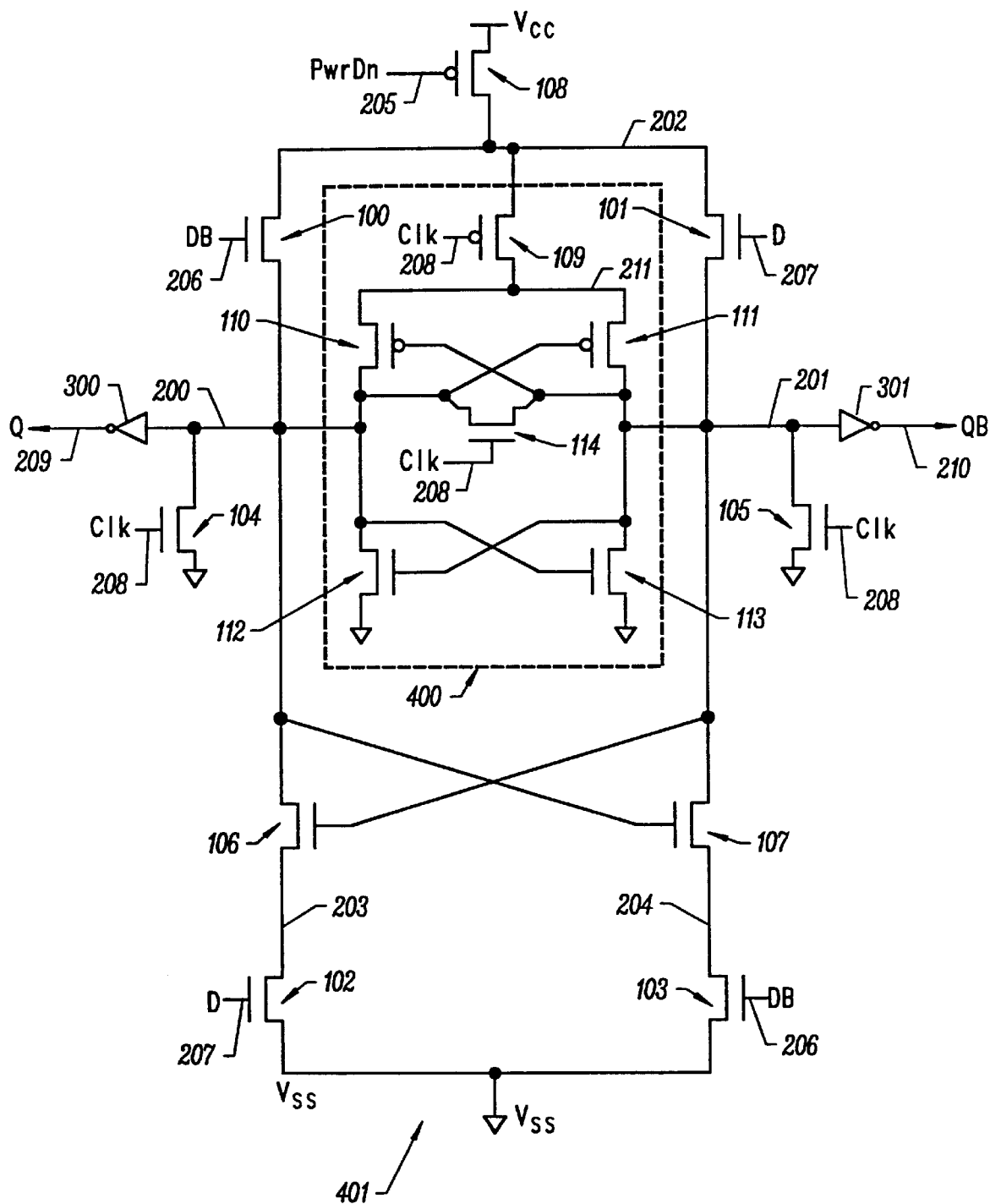
FIG. 3 is a circuit diagram of the receiver of FIG. 2 showing the details of the sense amplifier.

FIG. 3 shows a detailed diagram of the invention. It is easiest to describe the operation by starting from the state when Clk 208 is high. When Clk 208 is high, nfets 104 & 105 pull down nodes 200 & 201 very close to Vss, pre-discharging them. At the same time, nfet 114 aids the pre-discharge by equalizing the two nodes 200 and 201. When Clk 208 is high, pfet 109 is inactive, so there is no power supplied to the sense-amp 400, and pfets 110 & 111 are inactive. With both nodes 200 and 201 low, the source-coupled pair 102 and 103 in series with the power-savings devices 106 and 107 are also inactive. The source-follower nfets 100 & 101, however, are in the active saturation region and are providing differential current. Since pre-discharge transistors 104 & 105 are active, however, this differential current does not yet become differential voltage. Note also that during pre-discharge both the Q 209 and QB 210 outputs are both high.

When the Clk 208 falls, several effects occur. Pre-discharge transistors 104 and 105 release nodes 200 & 201, and the source-follower pair begins to pull-up 200 & 201. At the same time, Clk 208 falling has had the action of powering up the sense-amp 400 through pfet 109. As nodes 200 & 201 begin to rise, the source-follower pair maintains differential current until the differential voltage on 200 & 201 is equal to that on the differential inputs DB 206 & D 207 or until the voltage level has risen to just below the input voltage—Vtn of the source-follower transistors. For this reason the preferred embodiment uses low-Vt devices for 100 & 101. In the preferred embodiment devices 100 & 101 are the lowest-Vt devices available, frequently with Vt's of only 300 mV. Since it is always advantageous to keep the source-follower devices turned on, even 0-V Vt devices would be preferable, if available.

As 200 & 201 rise a Vtn above Vss, the power-isolation devices 106 & 107 turn on, enabling the source-coupled pair to apply differential current to 200 & 201 as well. Once nodes 200 & 201 are substantially above Vtn, the sense-amp transistors 110–113 take over and rapidly amplify the differential voltage present at 200 & 201 to the full-supply rail. Whichever node of 200 & 201 rises to Vdd produces a falling output from the corresponding inverter 300, 301. In the preferred embodiment, the inverters are sized so their trip points are above the voltage-level where 200 & 201 separate during sense-amplification. How far above this level is a trade-off of faster speed vs. better noise immunity.

Inverters 300 & 301 are sized in the preferred embodiment so that their trip point is just 200 mV above the separation point of nodes 200 & 201 as determined by the Vt's of nfets 112 and 113 of the sense-amp 400. A higher value than 200 mV unnecessarily delays the transition of the output. A lower value than 200 mV risks false tripping of an output inverter to the incorrect state before the sense-amp has resolved the value of the incoming data.

Figure 4:
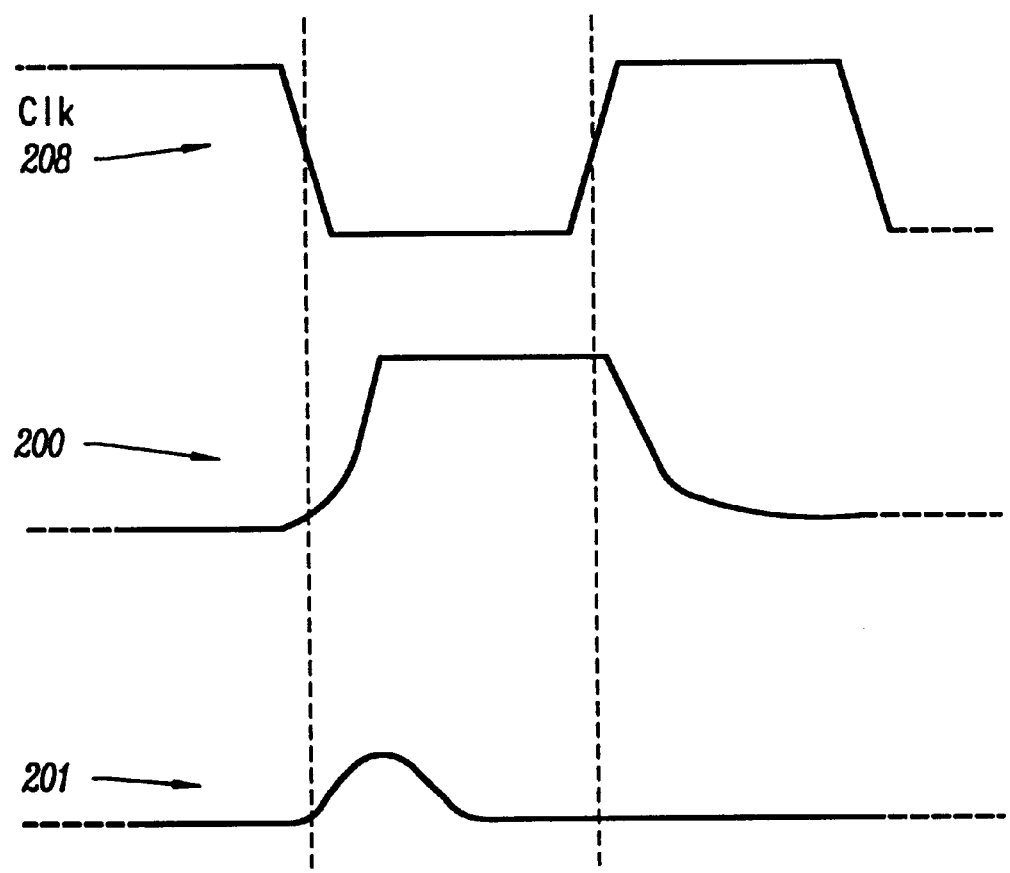
FIG. 4 is a timing diagram illustrating the clock signals and internal nodes of the circuit of FIG. 3.

FIG. 4 illustrates the timing, with both nodes 200 and 201 initially rising on the falling edge of clock 208. One of the nodes will go high with the other eventually returning to a low level after an initial small rise. in the example of FIG. 4, node 201 returns to a low level, while node 200 continues to climb to the high level as driven by the sense amplifier.

The latency of the receiver is less than one half of a clock period as it truly functions like an edge-triggered device; there are no phases dedicated solely to isolation or amplification. After Clk 208 has fallen, the output data remains valid until the rising edge of Clk 208, when nodes 200 & 201 are pre-discharged and equalized again, and the receiver is ready for the next falling edge of Clk 208.

Power-saving devices 106 & 107 eliminate part of the static current that would otherwise be present when Clk 208 was low. By turning on only when the complementary side is higher than vtn, they ensure no static power is consumed through nfets 102 & 103. However, source-follower devices 100 & 101 are both on when Clk 208 is high and both 200 & 201 are low, and one of them is on when Clk 208 is low and data has been evaluated. Thus, there is always some static power consumed if PwrDn 205 is not high. When PwrDn 205 is brought high, node 202 discharges to Vss and nodes 200 & 201 discharge to Vss. Power consumed in this mode is negligible. As voltages present in this mode are extremely similar to those in the pre-discharged state, not much setup time is needed to transition from this power-down state to an active one. Less than 1 cycle is required to use pfet 108 to charge up node 202 and turn on the source-follower pair 100 & 101. In the preferred embodiment, pfet 108 is also given a large W/L to reduce resistance to Vdd for both sensing and recovery from power-down. Pfet 108's W/L is preferably about 100 or more contrasted to normal ratios of 5–40 for other devices, wherein the L is set by the minimum feature size for the process.

As will be understood by those of skill in the art, the present invention may be embodied in other specific forms without departing from the spirit or essential characteristics thereof. For example, other circuit configurations for the clocked sense amplifier 400 could be used. Accordingly, the foregoing description is intended to be illustrative, but not limiting, of the scope of the invention which is set forth in the following claims.

What is claimed is:

1. A receiver circuit comprising:
    a pair of nodes;
    a source follower pair of MOS transistors having a pair of sources coupled respectively to said pair of nodes, and a pair of gates coupled respectively to a pair of differential inputs;
    a source coupled pair of MOS transistors having a pair of drains coupled respectively to said pair of nodes, and a pair of gates coupled respectively to the pair of differential inputs; and
    a sense amplifier to convert signals at said pair of nodes from small swing signals into CMOS-level signals in response to and within a period of a clock signal.

2. The circuit of claim 1 wherein a first input of the pair of differential inputs is coupled to the gate of a first transistor of the source follower pair and to the gate of a first transistor of the source coupled pair, the source of the first transistor of the source follower pair being coupled to a first node of the pair of nodes, and the drain of the first transistor of the source coupled pair being coupled to a second node of the pair of nodes.

3. The circuit of claim 1 wherein said MOS transistors are nMOS transistors.

4. The circuit of claim 1 further comprising first and second pre-discharge transistors coupled to said nodes, and having gates coupled to a clock input.

5. The circuit of claim 1 further comprising:
   a first power savings transistor connected between a first one of said source coupled transistors and a first one of said nodes, said first power savings transmitter having a gate coupled to a second one of said nodes; and
   a second power savings transistor connected between a second one of said source coupled transistors and a second one of said nodes, said second power savings transmitter having a gate connected to said first one of said nodes.

6. The circuit of claim 1 wherein said source follower transistors have a Vt of approximately 300 millivolts or less.

7. The circuit of claim 1 further comprising:
   first and second inverters having inputs connected to respective ones of said nodes, and
   outputs connected as outputs of said receiver circuit.

8. The circuit of claim 7 wherein said inverters have a trip point at a voltage level above a point of separation of said nodes during amplification by said sense amplifier.

9. The circuit of claim 8 wherein said voltage level is approximately 200 millivolts above said point of separation.

10. The circuit of claim 1 further comprising:
    a power down transistor connected between a power supply and drains of said source follower pair of MOS transistors, said power down transistor having a gate coupled to a power down line.

11. The circuit of claim 10 wherein said power down transistor has a W/L ratio of greater than 100.

12. A receiver circuit comprising:
    a pair of nodes;
    a source follower pair of MOS transistors having a pair of sources coupled respectively to said pair of nodes, and a pair of gates coupled respectively to a pair of differential inputs;
    a source coupled pair of MOS transistors having a pair of drains coupled to said pair of nodes, and a pair of gates coupled respectively to the pair of differential inputs;
    a sense amplifier coupled to said nodes;
    first and second pre-discharge transistors coupled to said nodes, and having gates coupled to a clock input;
    a first power savings transistor connected between a first one of said source coupled transistors and a first one of said nodes, said first power savings transistor having a gate coupled to a second one of said nodes;
    a second power savings transistor connected between a second one of said source coupled transistors and a second one of said nodes, said second power savings transistor having a gate connected to said first one of said nodes;
    first and second inverters having inputs connected to respective ones of said nodes, and outputs connected as outputs of said receiver circuit; and
    a power down transistor connected between a power supply and the drains of said source follower pair of MOS transistors, said power down transistor having a gate coupled to a power down line.

13. The circuit of claim 12 wherein said inverters have a trip point at a voltage level above a point of separation of said nodes during amplification by said sense amplifier.

14. The circuit of claim 13 wherein said voltage level is approximately 200 millivolts above said point of separation.

15. The circuit of claim 12 wherein said source follower transistors have a Vt of approximately 300 millivolts or less.

16. The circuit of claim 12 wherein said power down transistor has a W/L ratio of greater than 100.

17. A receiver circuit comprising:
    first and second transistors having respective gate terminals and source terminals, the gate terminals being coupled to receive respective first and second input signals, respectively;
    third and fourth transistors having respective gate terminals and drain terminals, the gate terminals being coupled to receive the first and second input signals, respectively, and the drain terminals being coupled respectively to the source terminals of the first and second transistors; and
    a sense amplifier coupled to the source terminals of the first and second transistors, the sense amplifier being configured to amplify respective signals on the source terminals from small-swing signals to CMOS-level signals in response to, and within a single cycle of, a clock signal.

18. The receiver circuit of claim 17 wherein at least one of the first, second, third and fourth transistors is an n-type MOS transistor.

19. The receiver circuit of claim 17 wherein the source terminal of the first transistor is coupled to the drain terminal of the third transistor, the source terminal of the second transistor is coupled to the drain terminal of the fourth transistor, the gate terminals of the first and fourth transistors are coupled to receive the first input signal, and the gate terminals of the second and third transistors are coupled to receive the second input signal.

20. The receiver circuit of claim 17 further comprising fifth and sixth transistors, each coupled between a reference voltage and a respective one of the source terminals of the first and second transistors, the fifth and sixth transistors having respective gates terminals coupled to receive the clock signal such that the source terminals of the first and second transistors are coupled to the reference voltage via the fifth and sixth transistors during a portion of each cycle of the clock signal.

21. The receiver circuit of claim 17 further comprising fifth and sixth transistors and wherein the drain terminals of the third and fourth transistors are coupled to the source terminals of the first and second transistors via the fifth and sixth transistors, respectively.

22. The receiver of claim 17 further comprising fifth and sixth transistors, the fifth transistor being coupled between the source of the first transistor and the drain of the third transistor and having a gate terminal coupled to the source of the second transistor, the sixth transistor being coupled between the source of the second transistor and the drain of the fourth transistor and having a gate terminal coupled to the source of the first transistor.

23. A receiver circuit comprising:
    a first MOS transistor having a first gate, a first source and a first drain, the first gate being coupled to a first input signal of a pair of low-swing, differential signals, the first source being coupled to a first node;

a second MOS transistor having a second gate, a second source and a second drain, the second gate being coupled to a second input signal of the pair of low-swing, differential signals, the second source being coupled to a second node;

a third MOS transistor having a third gate, a third source and a third drain, the third gate being coupled to the first input signal, the third drain being coupled to the second node;

a fourth MOS transistor having a fourth gate, a fourth source and a fourth drain, the fourth gate being coupled to the second input signal, the fourth drain being coupled to the first node; and a sense amplifier having a first, second and third port, the first port being coupled to the first node, the second port being coupled to the second node, and the third port being coupled to a clock signal having a clock period, within a single clock period the sense amplifier converting the first and the second input signals into a first CMOS output signal coupled to the first node and a second CMOS output signal coupled to the second node.

24. The receiver circuit of claim 23 wherein the first, second, third and fourth MOS transistors are nMOS transistors.

25. The receiver circuit of claim 23 further comprising:
a first pre-discharge transistor having a fifth gate, a fifth source and a fifth drain, the fifth drain being coupled to the first node, the fifth gate being coupled to the clock signal; and a second pre-discharge transistor having a sixth gate, a sixth source and a sixth drain, the sixth drain being coupled to the second node, and the sixth gate being coupled to the clock signal.

26. The receiver circuit of claim 23 further comprising:
a first power savings transistor having a seventh gate, a seventh source and a seventh drain, the seventh drain being connected to the second node, the seventh gate being coupled to the first drain, and the seventh source being connected to the third drain; and a second power savings transistor having an eighth gate, an eighth source and an eighth drain, the eighth drain being coupled to the first node, the eighth gate being coupled to the second node, and the eighth source being connected to the fourth drain.

27. The receiver circuit of claim 23 wherein the third and fourth MOS transistors have a threshold voltage of approximately 300 millivolts or less.

28. The receiver circuit of claim 23 further comprising:
a first inverter having a first inverter input coupled to the first node and a first inverter output coupled to a first output node of the receiver circuit, the first output node providing the first CMOS output signal; and a second inverter having a second inverter input coupled to the second node a second inverter output coupled to a second output node of the receiver circuit, the second output providing the second CMOS output signal.

29. The receiver circuit of claim 28 wherein the first and second inverters each have a trip point voltage level above a point of separation voltage level of the first and second nodes during amplification by the sense amplifier.

30. The receiver circuit of claim 29 wherein the trip point voltage level is approximately 200 millivolts above the point of separation voltage level.

31. The receiver circuit of claim 23 further comprising:
a power down transistor having a ninth gate, a ninth source and a ninth drain, the ninth drain being coupled to a power down signal, the ninth drain being coupled to a power supply and the ninth source being connected to the first drain and the second drain.

32. The receiver circuit of claim 31 wherein the power down transistor has a W/L ratio of greater than 100.

33. A receiver circuit comprising:
a first MOS transistor having a first gate, a first source and a first drain, the first gate being coupled to a first input signal of a pair of low-swing, differential signals, the first source being coupled to a first node;

a second MOS transistor having a second gate, a second source and a second drain, the second gate being coupled to a second input signal of the pair of low-swing, differential signals, the second source being coupled to a second node;

a third MOS transistor having a third gate, a third source and a third drain, the third gate being coupled to the first input signal, the third drain being coupled to the second node;

a fourth MOS transistor having a fourth gate, a fourth source and a fourth drain, the fourth gate being coupled to the second input signal, the fourth drain being coupled to the first node;

a sense amplifier having a first, second and third port, the first port being coupled to the first node, the second port being coupled to the second node, and the third port being coupled to a clock signal having a clock period, within a single clock period the sense amplifier converting the first and the second input signals into a first CMOS output signal coupled to the first node and a second CMOS output signal coupled to the second node;

a first pre-discharge transistor having a fifth gate, a fifth source and a fifth drain, the fifth drain being coupled to the first node, the fifth gate being coupled to the clock signal;

a second pre-discharge transistor having a sixth gate, a sixth source and a sixth drain, the sixth drain being coupled to the second node, and the sixth gate being coupled to the clock signal;

a first power savings transistor having a seventh gate, a seventh source and a seventh drain, the seventh drain being connected to the second node, the seventh gate being coupled to the first drain, and the seventh source being connected to the third drain;

a second power savings transistor having an eighth gate, an eighth source and an eighth drain, the eighth drain being coupled to the first node, the eighth gate being coupled to the second node, and the eighth source being connected to the fourth drain;

a first inverter having a first inverter input coupled to the first node and a first inverter output coupled to a first output node of the receiver circuit, the first output node providing the first CMOS output signal;

a second inverter having a second inverter input coupled to the second node a second inverter output coupled to a second output node of the receiver circuit, the second output node providing the second CMOS output signal; and a power down transistor having a ninth gate, a ninth source and a ninth drain, the ninth drain being coupled to a power down signal, the ninth drain being coupled to a power supply and the ninth source being connected to the first drain and the second drain.

34. The receiver circuit of claim 33 wherein the first and second inverters each have a trip point voltage level above a point of separation voltage level of the first and second nodes during amplification by the sense amplifier.

35. The receiver circuit of claim 34 wherein the trip point voltage level is approximately 200 millivolts above the point of separation voltage level.

36. The receiver circuit of claim 33 wherein the third and fourth MOS transistors have a threshold voltage of approximately 300 millivolts or less.

37. The receiver circuit of claim 33 wherein the power down transistor has a W/L ratio of greater than 100.

* * * * *